US010433455B2

(12) United States Patent
Jansen et al.

(10) Patent No.: US 10,433,455 B2
(45) Date of Patent: Oct. 1, 2019

(54) WIRING DEVICE WITH HEAT REMOVAL SYSTEM

(71) Applicant: LEVITON MANUFACTURING CO., INC., Melville, NY (US)

(72) Inventors: Ronald Jansen, Ridgewood, NY (US); Scott Freeman, Melville, NY (US); Adam Kevelos, Plainview, NY (US); Will Ziegler, East Northport, NY (US); Ben Moadel, Centerport, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 216 days.

(21) Appl. No.: 15/085,060

(22) Filed: Mar. 30, 2016

(65) Prior Publication Data

US 2017/0290195 A1    Oct. 5, 2017

(51) Int. Cl.
| | |
|---|---|
| *H02G 3/03* | (2006.01) |
| *H05K 7/20* | (2006.01) |
| *H01R 24/62* | (2011.01) |
| *H01R 24/76* | (2011.01) |
| *H02G 3/18* | (2006.01) |
| *H01R 13/10* | (2006.01) |
| *H01R 103/00* | (2006.01) |
| *H01R 107/00* | (2006.01) |
| *H02G 3/08* | (2006.01) |

(52) U.S. Cl.
CPC ......... *H05K 7/20136* (2013.01); *H01R 24/62* (2013.01); *H01R 24/76* (2013.01);
(Continued)

(58) Field of Classification Search
CPC .... H01R 2103/00; H01R 24/62; H01R 24/76; F04D 25/166; H05K 7/20136; H05K 7/20209; H02G 3/18
(Continued)

(56) References Cited

U.S. PATENT DOCUMENTS

| | | | | |
|---|---|---|---|---|
| 7,035,126 B1 * | 4/2006 | Lanni | .................. | H01R 31/065 363/142 |
| 7,693,292 B1 * | 4/2010 | Gross | .................. | G10K 11/178 381/71.14 |

(Continued)

FOREIGN PATENT DOCUMENTS

| | | | |
|---|---|---|---|
| CN | 204348967 | * | 5/2015 |
| CN | 204348967 U | | 5/2015 |
| CN | 205319441 U | | 6/2016 |

OTHER PUBLICATIONS

International Search Report and Written Opinion dated Jul. 4, 2017 for PCT/US2017/023292 filed Mar. 21, 2017.

*Primary Examiner* — Brian W Wathen
*Assistant Examiner* — Brian T McMenemy

(57) ABSTRACT

A wiring device includes a housing that encloses a line voltage port and/or a low voltage port for providing power to at least one removable load. The housing has an intake opening and an exhaust opening for drawing cooling air into the housing and for exhausting heated air. A fan is disposed within the housing and operates to move the air through the housing. A thermal load such as a heat sink or a transformer is positioned within the housing and receives cooling air to reduce the temperature of the load. The fan is energized when a sensed temperature in the housing exceeds a first predetermined threshold. Power to the line and/or low voltage port is reduced or shut off if the sensed temperature in the housing exceeds a predetermined value that is greater than the first predetermined threshold.

24 Claims, 7 Drawing Sheets

(52) U.S. Cl.
CPC ............... *H02G 3/03* (2013.01); *H02G 3/18* (2013.01); *H05K 7/20209* (2013.01); *H01R 2103/00* (2013.01); *H01R 2107/00* (2013.01); *H02G 3/081* (2013.01)

(58) Field of Classification Search
USPC .......................................... 361/695; 165/122
See application file for complete search history.

(56) References Cited

U.S. PATENT DOCUMENTS

| | | | |
|---|---|---|---|
| 9,368,982 B2 | 6/2016 | Jansen et al. | |
| 2006/0087815 A1* | 4/2006 | Lanni ................ | H05K 7/20136 361/695 |
| 2007/0089011 A1* | 4/2007 | Dodeja .............. | G05B 23/0235 714/742 |
| 2007/0297893 A1* | 12/2007 | Alon .................... | F04D 25/166 415/47 |
| 2009/0167537 A1* | 7/2009 | Feliss .................... | B60L 3/0069 340/584 |
| 2010/0008037 A1* | 1/2010 | Tuma ...................... | G06F 1/206 361/679.48 |
| 2011/0136374 A1 | 6/2011 | Mostoller et al. | |
| 2012/0056495 A1* | 3/2012 | Carson ..................... | H02H 3/12 307/117 |
| 2012/0202373 A1 | 8/2012 | Klinghult | |
| 2012/0302092 A1* | 11/2012 | Kaps ................. | H01R 13/6683 439/535 |
| 2013/0257683 A1* | 10/2013 | Aruga .................... | G09G 5/003 345/1.2 |
| 2015/0038006 A1 | 2/2015 | Jansen et al. | |

\* cited by examiner

WIRING DEVICE WITH HEAT REMOVAL SYSTEM

FIELD OF THE DISCLOSURE

The present disclosure relates generally to wiring devices having heat removal systems, and more particularly to an in-wall wiring device incorporating a fan to remove heat.

BACKGROUND OF THE DISCLOSURE

Residential buildings have wall outlets for powering electronic devices such as lights, appliances, computers, and mobile devices. Such wall outlets typically provide alternating current (AC) to AC powered devices as well as to devices which first convert/transform the AC power to direct current (DC) or some other AC voltage/frequency via an external internal transformer. Such devices have a power cord with a plug configured to be connected to and removed from the wall outlet.

Due to the proliferation of various consumer electronic devices that are powered by batteries providing direct current (DC), such as cell phones, laptops, tablets, personal digital assistants (PDA's), and the like, there is a need to power and/or charge such devices. Most of these devices are powered by low voltage DC. Recharging these devices may be facilitated through the use of standard interfaces such as a Universal Serial Bus (USB) charging device. Some of these charging devices have been incorporated into wall outlets. Such charging devices may be designed to provide power to multiple electronic devices simultaneously.

For cases in which multiple device are coupled to a single USB charging device, the charging current requested by each of the electronic devices may exceed an output charging current capacity of the charging device. Some conventional USB charging device address this by limiting current flow to a channel that supplies the charging current to the USB port that the electronic device(s) is/are attached. Limiting charging current in this manner, however, can lead to overheating of the USB charging device, which, in turn, can lead to channel shut down and/or the USB charging device not functioning as intended.

SUMMARY

This summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of a wiring device in accordance with the present disclosure can include a housing, a fan, and a thermal load. The housing may enclose at least one of a line voltage port and a low voltage port for providing power to a removable load. The housing may have an intake opening in a first surface thereof for directing cooling air into an internal portion of the housing. The housing may have an exhaust opening in a second surface thereof for exhausting heated air from the internal portion of the housing. The fan may be disposed within the housing. The fan may be operable to draw the cooling air in through the intake opening and to exhaust the heated air through the exhaust opening. The thermal load may be disposed within the housing. The thermal load may be positioned to receive the cooling air to reduce a temperature of the thermal load.

A wiring device is disclosed, and can include a housing, a fan, a switch, and a thermal load. The housing may enclose a port for providing power to a removable load. The housing may include an intake opening for directing cooling air into an internal portion of the housing. The housing may include an exhaust opening for exhausting heated air from the internal portion of the housing. The fan may be disposed within the housing. The fan may be operable to move air between the intake opening and the exhaust opening. The switch may activate the fan when a temperature of the internal portion of the housing is sensed to exceed a first predetermined threshold. The thermal load may be disposed within the housing. The thermal load may be positioned to receive the cooling air to reduce a temperature of the thermal load.

A method is disclosed for removing heat from a wiring device. The method may include receiving a current from a power supply; providing the received current to at least one of a line voltage port and a low voltage port of the wiring device; providing a first removable load with the current via the at least one line voltage port and low voltage port of the wiring device; determining a temperature within a housing of the wiring device; and energizing or de-energizing a fan disposed within a housing of the wiring device based on the determined temperature.

BRIEF DESCRIPTION OF THE DRAWINGS

By way of example, exemplary embodiments of the disclosed device will now be described, with reference to the accompanying drawings, in which.

DETAILED DESCRIPTION

The following disclosure is intended to provide exemplary embodiments of the disclosed system and method, and these exemplary embodiments should not be interpreted as limiting. One of ordinary skill in the art will understand that the steps and methods disclosed may easily be reordered and manipulated into many configurations, provided they are not mutually exclusive. As used herein, "a" and "an" may refer to a single or plurality of items and should not be interpreted as exclusively singular unless explicitly stated.

Figure 1:
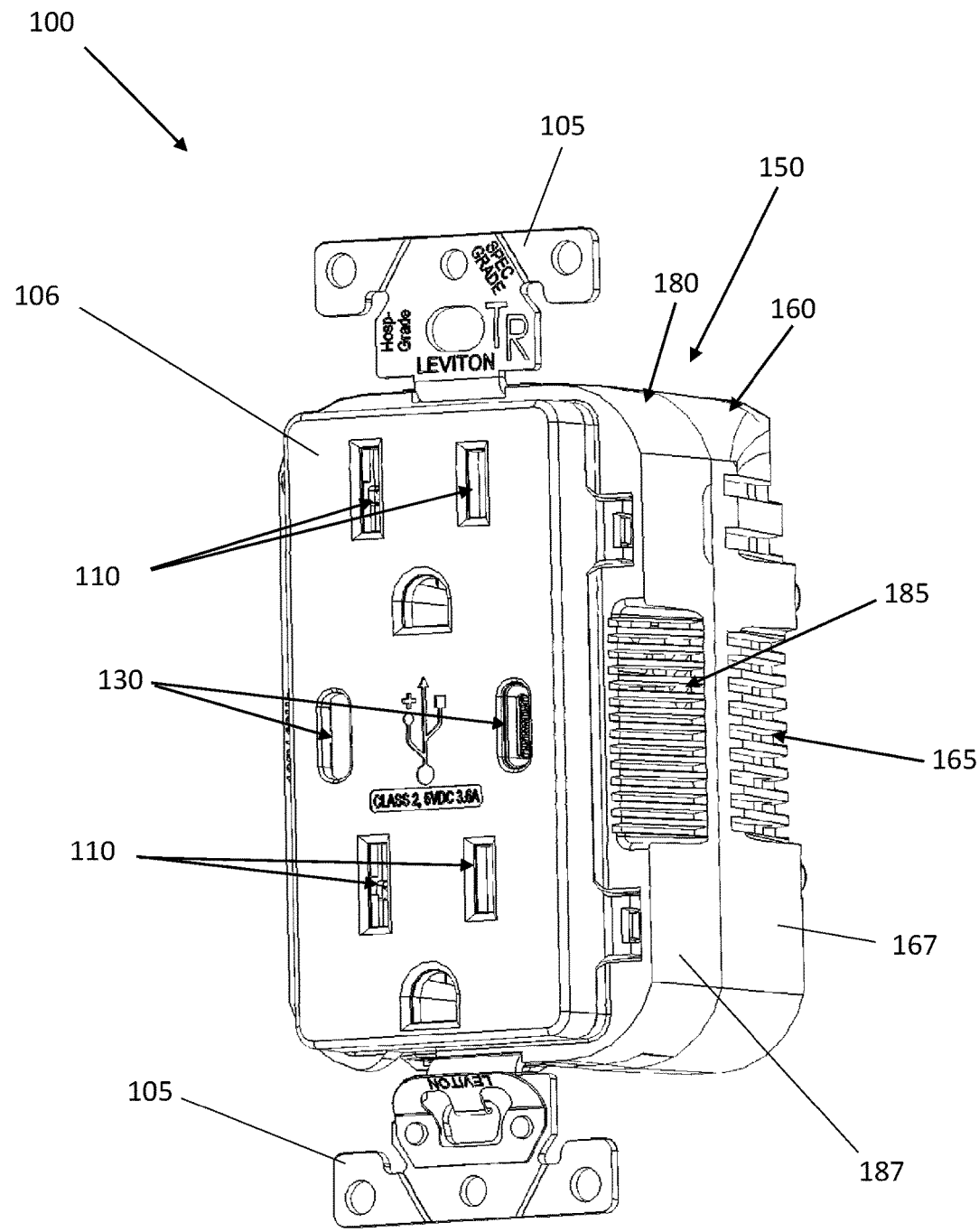
FIG. 1 is an isometric view of an exemplary embodiment of a wiring device according to the present disclosure.

Referring to FIG. 1, a wiring device 100 consistent with a non-limiting, exemplary embodiment of the present disclosure is shown. As will be appreciated, wiring devices are normally fastened to electrical boxes in walls and ceilings of buildings or in other suitable locations. Some examples of wiring devices include, but are not limited to, switches, outlets, circuit interrupters, dimmers, occupancy sensors, and the like. Additionally, any suitable combinations of these devices can be integrated into a single wiring device.

In the illustrated embodiment the wiring device 100 includes a strap 105, a front face 106, line-voltage ports 110, low-voltage ports 130, and a housing 150. The housing 150 may include rear and front cover portions 160, 180 that, when assembled, enclose a variety of components for delivering power from a line power source (not shown) to the line-voltage ports 110 and the low-voltage ports 130.

Line voltage refers to a voltage, typically Alternating Current (AC), that is supplied to buildings/residences (e.g., electric light and power), for example, 110 VAC, 115 VAC, 120 VAC, 125 VAC, 208 VAC, 220 VAC, 230 VAC, 240 VAC, single or multiphase. Line voltage is typically made available to the end user standard plug/outlet configurations standardized by the National Electrical Manufacturers' Association (NEMA) configurations.

Low voltage refers to a voltage which is less than a certain threshold (50 Volts for example, AC or DC). This reduced voltage is typically used for communication, signaling, data/multimedia transmission, low voltage charging, and the like. For the purposes of the present disclosure, the term low voltage also includes optical transmission (although no electrical voltage is actually transmitted by optical transmission).

Low voltage ports denote any suitable type of low voltage ports, such as, but not limited, to Universal Serial Bus (USB), Audio/Video/Multimedia ports, Digital Visual Interface (DVI), Ethernet/data ports, High Definition Multimedia Interface (HDMI), IEEE 1394 (FireWire), Separate Video (S-Video), Video Graphics Array (VGA), Telephone, and the like, or any suitable combination thereof. For the purposes of the present disclosure, low voltage ports can also include fiber optic ports (although no electrical voltage is actually transmitted by fiber optic ports). USB ports can further be broken out into various form factors such as Type A, Type B, Mini-A, Mini-B, Micro-A, Micro-B, or any other suitable form.

In some embodiments the wiring device 100 may include a ground fault current interrupter (GFCI). In such instances the housing 150 can also include the components associated with the GFCI, including one or more transformers, capacitors and the like. It will be appreciated that although the illustrated wiring device 100 is described as including both line-voltage and low-voltage ports 110, 130, such is not critical and the disclosure contemplates wiring devices having only low-voltage ports, only line-voltage ports or other permutations.

As can be seen, the rear cover portion 160 may include an intake opening 165 in a side portion 167 thereof. Similarly, the front cover portion 180 may include an exhaust opening 185 in an adjacent side portion 187 thereof. The intake and exhaust openings 165, 185 each can comprise a plurality of openings, slots or louvers that enable air to pass through the openings into or out of the housing 150. As will be appreciated, such air flow can allow the cooling of heated and/or heat-generating components contained within the housing. Although the intake and exhaust openings 165, 185 are shown as being disposed in respective side portions 167, 187 of the rear and front cover portions 160, 180, the openings can be disposed in any surface (e.g., top, bottom, front, rear) of the housing that enables the passage of air through the housing 150 in a manner that works to cool the components disposed within the housing. In addition, the size, shape and orientation of the openings 165, 185 can be as desired to provide a desired cooling flow through the housing 150. Further, it is not critical that the intake opening 165 be provided in the rear cover portion 160 and the exhaust opening 185 be provided in the front cover portion 180. Rather, the air flow may be reversed without departing from the spirit of the disclosure. It will also be appreciated that the intake and exhaust openings 165, 185 could both be provided in either the rear cover portion 160 or the front cover portion 185. In addition, multiple individual sets of intake and exhaust openings could be provided in any surface of the housing 150 to provide a desired cooling flow.

As mentioned, the wiring device 100 may include a strap 105 configured to enable the wiring device 100 to be installed within an electrical junction box in a building to create an in-wall wiring device. In some embodiments, the wiring device 100 may be flush mounted in a wall of the building. The strap 105 may also enable a cover plate (not shown) to be attached to conceal the strap 105 and at least a portion of the housing 150 while enabling access to the line and low-voltage ports 110, 130 through associated apertures in a front face 106 of the wiring device.

The line and low-voltage ports 110, 130 may each have a plurality of conductive terminals to allow the ports 110, 130 to conductively couple with one or more removable loads $102_1$-$102_n$ (see, e.g., FIG. 5) such as lighting devices, any of a variety of consumer electronics (e.g., desktop computers), mobile devices (e.g., smart phones) and the like. In some embodiments, the wiring device 100 can deliver power in a safe and efficient manner to one or more of the removable loads $102_1$-$102_n$ by electrically coupling with a port 110, 130 via at least two of the plurality of conductive terminals in each port 110, 130.

The low voltage ports 130 can be configured to provide a predetermined amount of charging current, or they may provide an amount of current required by the charged device (i.e., an on-demand current). In addition, low voltage ports 130 can be configured to provide a level of charging current based on the type of device that is plugged into the low voltage ports 130.

As will be appreciated, delivering power to the removable loads $102_1$-$102_n$ may result in the generation of heat within the housing 150. In addition, the housing 150 can include one or more thermal loads such as heat generating components (e.g., a transformer) or heat sinks that can further affect the temperature within the housing. Excessive heat trapped within the housing 150 can lead to adverse operation of the wiring device 100, and can speed component failure. The disclosed intake and exhaust openings 165, 185 can provide a path for the heat to be removed from the housing 150 by allowing air to flow through the housing. In some embodiments this airflow can be a convection airflow that facilitates the natural movement of cool air into and out of the housing 150. In other embodiments, an air movement device such as a fan can be provided to force a flow of cooling air through the housing 150.

Figure 2:
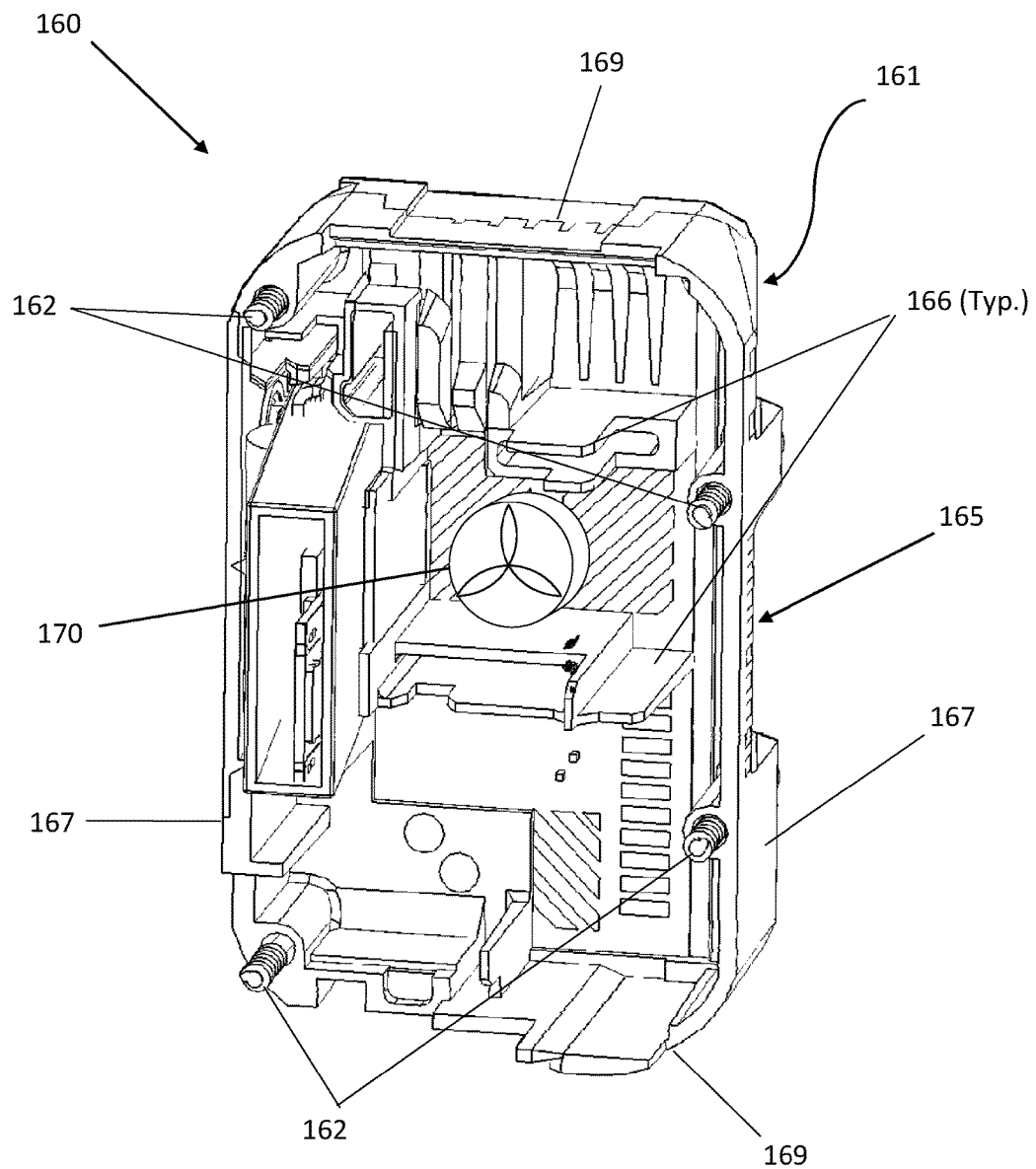
FIG. 2 is an isometric view of a rear cover portion of the wiring device of FIG. 1.

FIG. 2 shows a non-limiting exemplary internal structure of the rear cover portion 160 of the wiring device 100. The rear cover portion 160 can include a back portion 161, side portions 167, top and bottom portions 169 and a plurality of internal structural mounting features 166. As will be appreciated, the internal structural mounting features 166 can be configured to hold the internal components of the wiring device 100 such as printed circuit boards (PCBs), capacitors, transformers and power conductors in desired positions within the housing 150. In some embodiments the structural mounting features 166 may also facilitate isolation of the line voltage circuitry from the low voltage circuitry within the wiring device 100.

A fan 170 can be disposed within the housing 150 between the rear and front cover portions 160, 180. In the illustrated embodiment the fan 170 is disposed in the rear cover portion 160, though this positioning is not critical. In general, the fan 170 can operate to move air through the housing in a desired manner in order to cool one or more heated and/or heat generating components within the housing. This can be done in a variety of ways, either by drawing relatively cool outside air in through the intake opening 165 and over a component to be cooled, or by "blowing" relatively cool outside air over the component to be cooled. In the illustrated embodiment the fan 170 is positioned to draw air in through the opening 165 in the rear cover portion 160 and exhaust air through the exhaust opening 185 in the front cover 180 (FIG. 1), though it will be appreciated that the flow direction could be reversed. One or more heated and/or heat generating components may be positioned between the intake and exhaust openings 165, 185 so that relatively cool air is moved through the housing 150, providing a cooling air flow to the components.

The fan 170 may be sized and configured to fit conveniently within the housing 150 and to provide a rate of cooling air flow sufficient to cool the internal components of the wiring device 100. Exemplary flow ranges for the fan 170 may be from about 0.10 liters/minute (l/m) to about 2 l/m, though these values are non-limiting and other flow rates can be used as desired. One non-limiting exemplary embodiment of an appropriate fan 170 may a MagLev Motor Blower model UB393-700 manufactured by Sunonwealth Electric Machine Industry Co., Ltd., Taiwan R.O.C. It will be appreciated that this is but one possible fan, and other fan types and sizes can be used as appropriate.

In the illustrated embodiment the wiring device 100 further includes a plurality of fasteners 162 (e.g., screws, pins, clips) for coupling the rear cover portion 160 to the front cover portion 180 in a conventional manner to enclose the fan 170 and remaining components within the housing 150.

Figure 3:
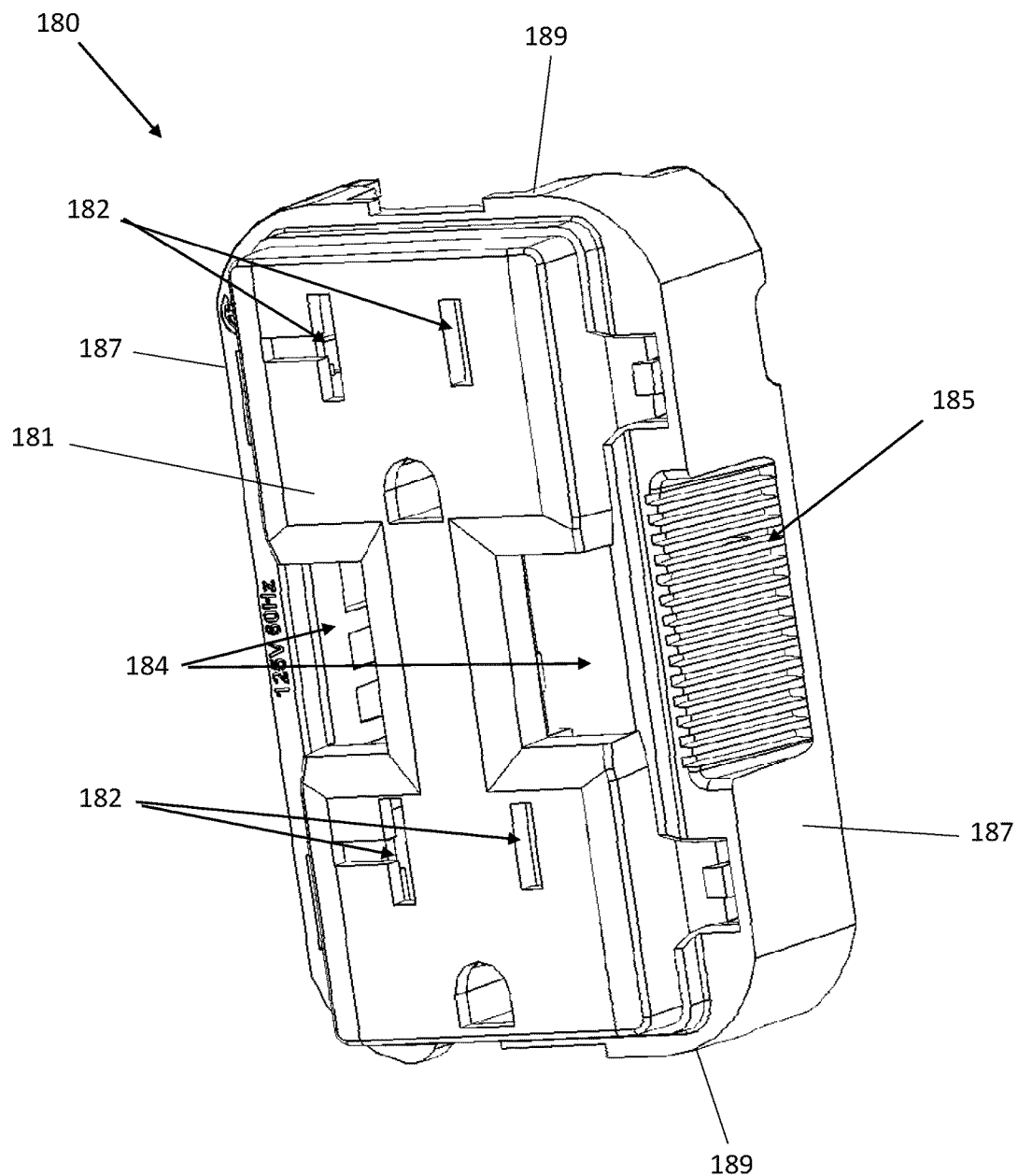
FIG. 3 is an isometric view of a front cover portion of the wiring device of FIG. 1.

Referring now to FIG. 3, the front cover portion 180 of the wiring device 100 can include a front portion 181, side portions 187 and top and bottom portions 189. The front cover portion 180 may have line-voltage openings 182, low-voltage openings 184, and exhaust opening 185. The low and line-voltage openings 182, 184 can facilitate access to the line and low-voltage ports 110, 130 within the housing 150. Though not visible in this view, it will be appreciated that the front cover portion 180 may include mounting features for mounting one or more components of the wiring device 100, such the line and/or low-voltage ports 110, 130.

Figure 4:
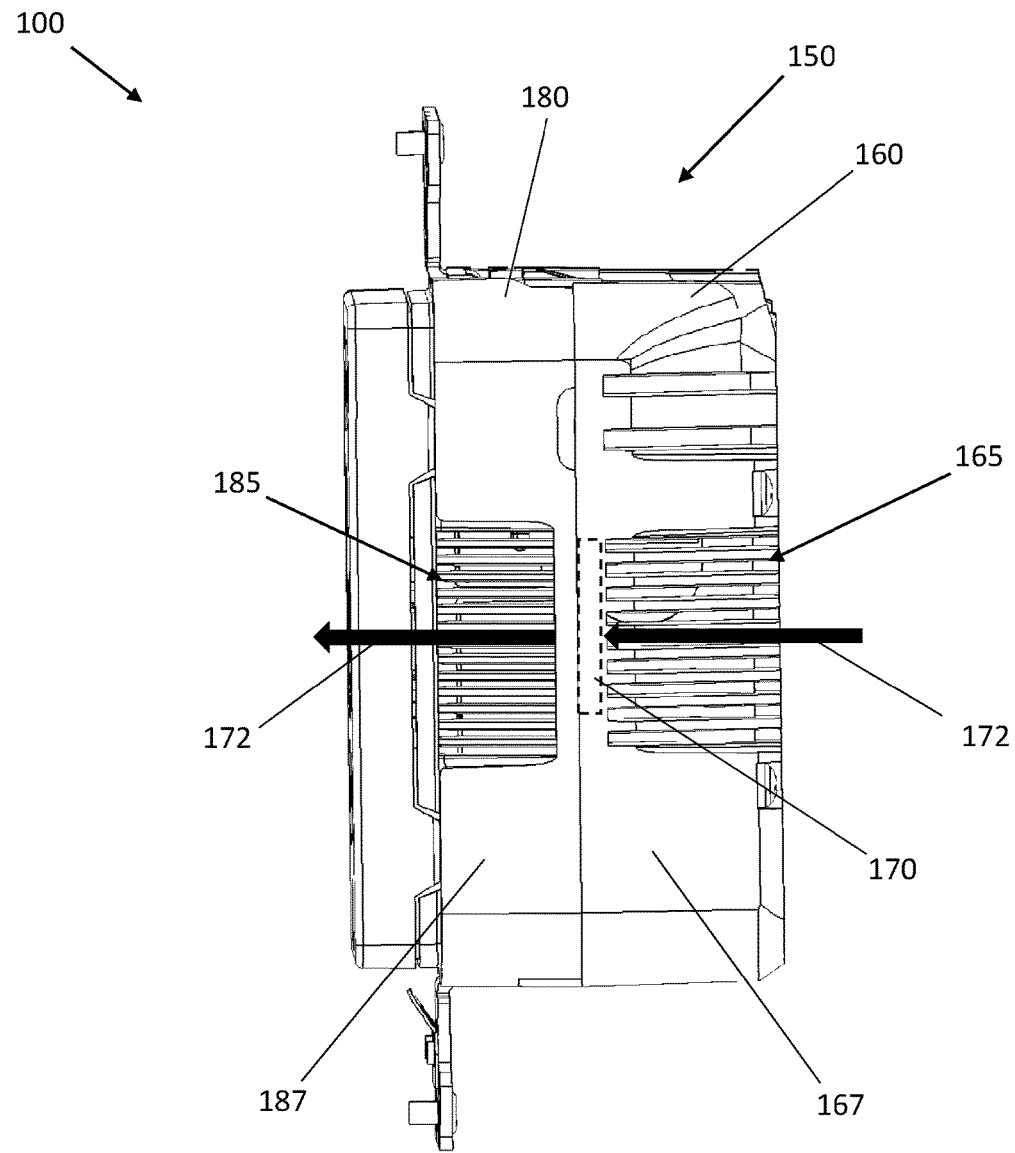
FIG. 4 is a side view of the wiring device of FIG. 1.

As mentioned, the fan 170 may draw relatively cool outside air in through the intake opening 165 in the rear cover portion 160 and may exhaust heated air out through the exhaust opening 185 in front cover portion 180. FIG. 4 shows a side view of the wiring device 100 in which the intake and exhaust openings 165, 185 in the rear and front cover portion 160, 180 are positioned adjacent to each other on respective side portions 167, 187. As previously noted, this arrangement of openings is merely illustrative and the intake and exhaust openings 165, 185 can be disposed in any of the surfaces of the rear and/or front cover portions 160, 180 to provide a desired cooling of one or more internal components of the wiring device 100.

In the illustrated embodiment, operation the fan 170 causes a pressure differential to be formed between the intake and exhaust openings 165, 185, resulting in air flow 172 through the housing 150. Although the described embodiment shows air flowing from the rear cover portion 160 to the front cover portion 180, one of ordinary skill in the art will appreciate that air could flow along any number of paths through the housing 150 without departing from the scope of this disclosure. In addition, though the illustration shows air flowing directly between the intake and exhaust openings 165, 185, it will be understood that air flow may be directed intermediately within the housing via one or more interior structural features so that cooling air is applied to the surface of one or more components to be cooled.

The fan 170 may be operated in a variety of ways to provide a desired cooling of the wiring device 100. For example, in one embodiment, the fan 170 may operate in a constant-on mode. In other embodiments, the fan 170 may operate only when a removable load $102_1$-$102_n$ is plugged into the wiring device 100. Alternatively, the wiring device 100 can include a temperature sensor that senses a temperature within the housing 150 and activates the fan 170 only when the temperature exceeds a first predetermined threshold. In some embodiments, the wiring device 100 may operate in a reduced power mode if the fan 170 is determined to have failed. Alternatively, the wiring device 100 may stop transmitting current to a removable load $102_1$-$102_n$ of the fan 170 is determined to have failed. Fan failure may be either directly determined, or may be inferred by an internal housing temperature that exceeds the first predetermined threshold by a predetermined amount. For instances in which the fan 170 is determined to have failed, the wiring device 100 may include a visual and/or audible indicator (not shown) to provide a visual and/or audible alert to a user. This functionality can be implemented with a combination of temperature sensors, microcontrollers and/or programming.

Figure 5:
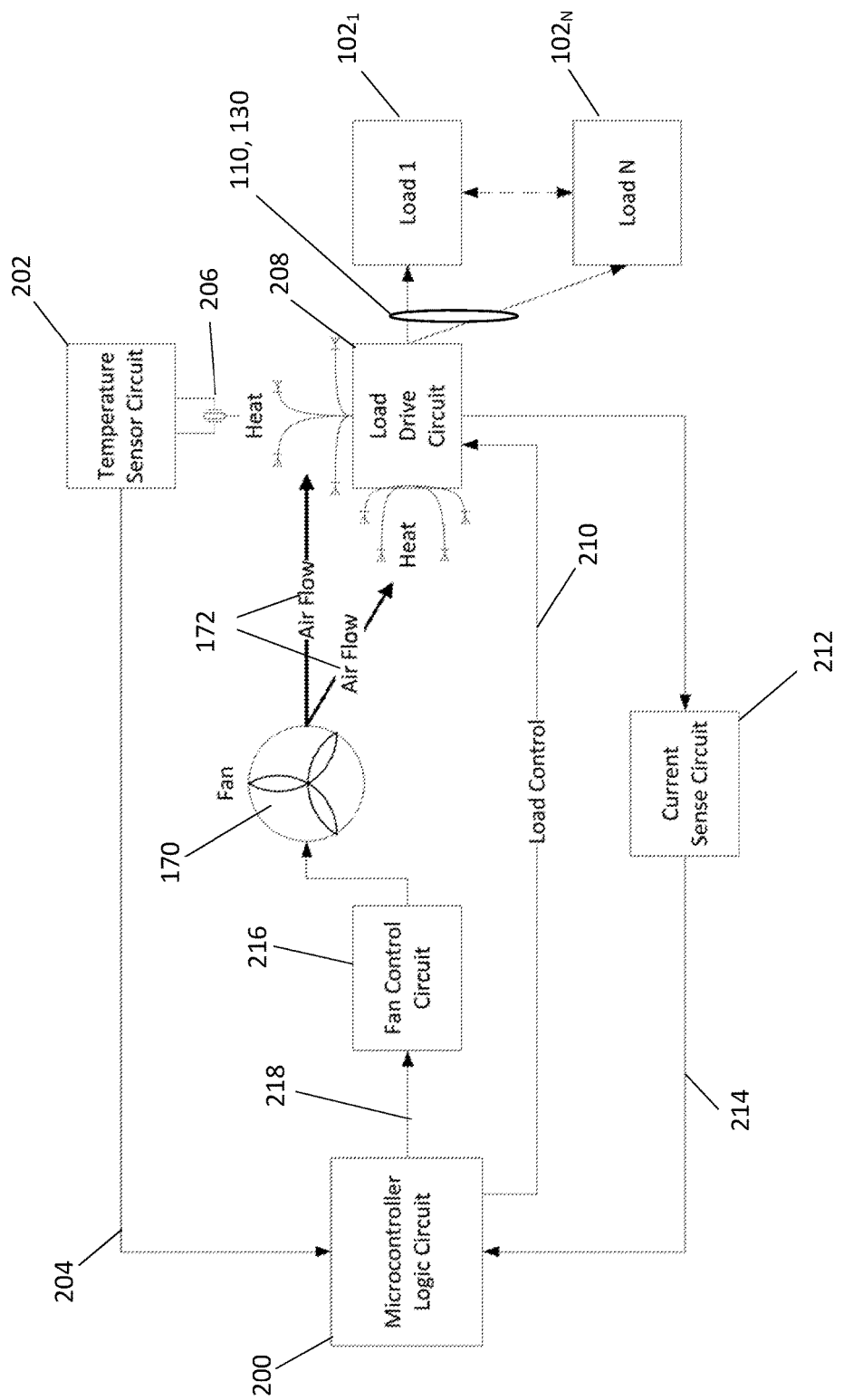
FIG. 5 is a block diagram of an exemplary embodiment of a wiring device according to the present disclosure.

Referring now to FIG. 5, an exemplary block diagram of the wiring device 100 is shown. As can be seen, the wiring device 100 may include a microcontroller logic circuit 200 for controlling elements of the temperature sensing and control features of the wiring device 100. The microcontroller logic circuit 200 may receive input from a temperature sensor circuit 202 via a temperature sensing signal line 204. The temperature sensor circuit 202 may include a temperature sensor 206 for sensing a temperature of an internal portion of the housing 150 of the wiring device 110. The microcontroller logic circuit 200 may command operation of a load drive circuit 208 via a load control signal line 210, and may receive feedback signals from the load drive circuit via a current sense circuit 212 and current sense signal line 214. The microcontroller logic circuit 200 may also command operation of the fan 170 via fan control circuit 216 and fan control signal line 218.

The load drive circuit 208 may be coupleable to one or more removable loads $102_1$-$102_n$ via a low voltage port 130 or a line voltage port 110 to control current applied to the loads as commanded by the microcontroller logic circuit 200.

As will be appreciated, the load drive circuit 208 and fan control circuit 216 and/or fan 170 may be coupled to a source of alternating current (AC) power (not shown) via appropriate rectifying circuitry and components, as will be appreciated by one of ordinary skill in the art.

As will be appreciated, the flow of electricity through the components of the wiring device 100 can create excess heat within the housing 150. For example, the conversion of an alternating current to a direct current by rectifying components and circuitry may produce relatively large amounts of heat within the housing 150, especially when multiple removable loads $102_1$-$102_n$ may be receiving power simultaneously. Thus, the microcontroller logic circuit 200 may, via fan control circuit 216, command operation of the fan 170 to reduce the level of heat within the housing 150.

Actively reducing the level of heat within the housing 150 can increase component life and performance.

In some embodiments the microcontroller logic circuit 200 may monitor and control the heat within the housing 150. Thus, the microcontroller logic circuit 200 may monitor the heat within the housing 150 via temperature sensor 206, which in non-limiting exemplary embodiments may be a thermocouple, a thermistor, a resistive temperature detector, or a semiconductor temperature sensor. In some embodiments the temperature sensor 206 and/or the temperature sensor circuit 202 may be integral to the microcontroller logic circuit 200. The temperature sensor 206 may sense a temperature (or temperature change) within the housing 150 and may convert the temperature or temperature change into a digital signal that the temperature sensor circuit 202 or microcontroller logic circuit 200 may interpret. The microcontroller logic circuit 200 may be programmed to control the heat within the housing when the temperature exceeds a first predetermined threshold. In one exemplary embodiment the first predetermined threshold may be about 60 degrees Celsius (C), though this value is not critical and other threshold values can be used as appropriate.

In some embodiments, the fan 170 may be energized when the logic circuitry 154 determines that the temperature within the housing 150 exceeds the first predetermined threshold. The microcontroller logic circuit 200 may maintain the fan 170 energized until the microcontroller logic circuit 200 determines that the temperature within the housing 150 decreases below the first predetermined threshold. Alternatively, the microcontroller logic circuit 200 may maintain the fan 170 energized until the logic circuitry determines that the temperature within the housing 150 decreases to a second predetermined threshold that is lower than the first predetermined threshold. For example, the fan may be energized when the microcontroller logic circuit 200 determines that the temperature within the housing is 60 C, and then the fan may remain energized until the microcontroller determines that the temperature within the housing has reached 50 C (i.e., the second predetermined threshold, which in this exemplary embodiment is 10 C below the first predetermined threshold.) It will be appreciated that the discrete values provided herein are merely exemplary, and that other temperature values can be employed as desired.

It will be appreciated that the microcontroller logic circuit 200 may command operation of the fan 170 at different speeds depending on the sensed temperature within the housing. Thus, in some embodiments once the fan 170 has been energized, the speed of the fan may be increased as temperature within the housing is sensed to continue to rise. Similarly, the speed of the fan may be decreased as temperature within the housing is sensed to decrease. Various temperature and power dependent fan speed controls are contemplated, as will be understood by one of ordinary skill in the art.

The microcontroller logic circuit 200 may control the heat within the housing 150 via fan control circuit 216, which may include one or more switches for energizing and de-energizing the fan 170. In some embodiments the microcontroller logic circuit 200 may include a processor and a non-transitory computer-readable medium. The processor may execute instructions stored on the non-transitory computer-readable medium to perform one or more of the functions and methods described herein. It will be appreciated that the microcontroller logic circuit 200 also could comprise an appropriate analog logic circuit, an application-specific integrated circuit (ASIC), or the like.

In some embodiments the microcontroller logic circuit 200 may include a safety shut off or shunt feature to reduce or disconnect current provided to the one or more removable loads $102_1$-$102_n$, via the load drive circuit 208. For example, current may be reduced to the one or more removable loads $102_1$-$102_n$ during abnormal operation such as an electrical or mechanical failure of the wiring device. For example, if the fan 170 fails, the amount of current provided to the one or more removable loads $102_1$-$102_n$, may be reduced to a level that will prevent the build-up of excess heat in the housing 150 while the fan 170 is not functional. In one embodiment, the fan 170 may be assumed to have failed if the temperature sensed by the temperature sensor 206 is determined to exceed the first predetermined threshold by a predetermined value. In one non-limiting example, if the first predetermined threshold is 60 C, and the second predetermined threshold is 40 C, the fan 170 may be deemed inoperable when the internal ambient temperature of the housing 150 reaches 75 C.

It will be appreciated that such a thresholding arrangement can be employed even where the fan 170 is operable. In such embodiments, the fan 170 can provide cooling while the load has been limited, thus allowing the fan to cool the load faster, preventing thermal runaway.

Figure 6:
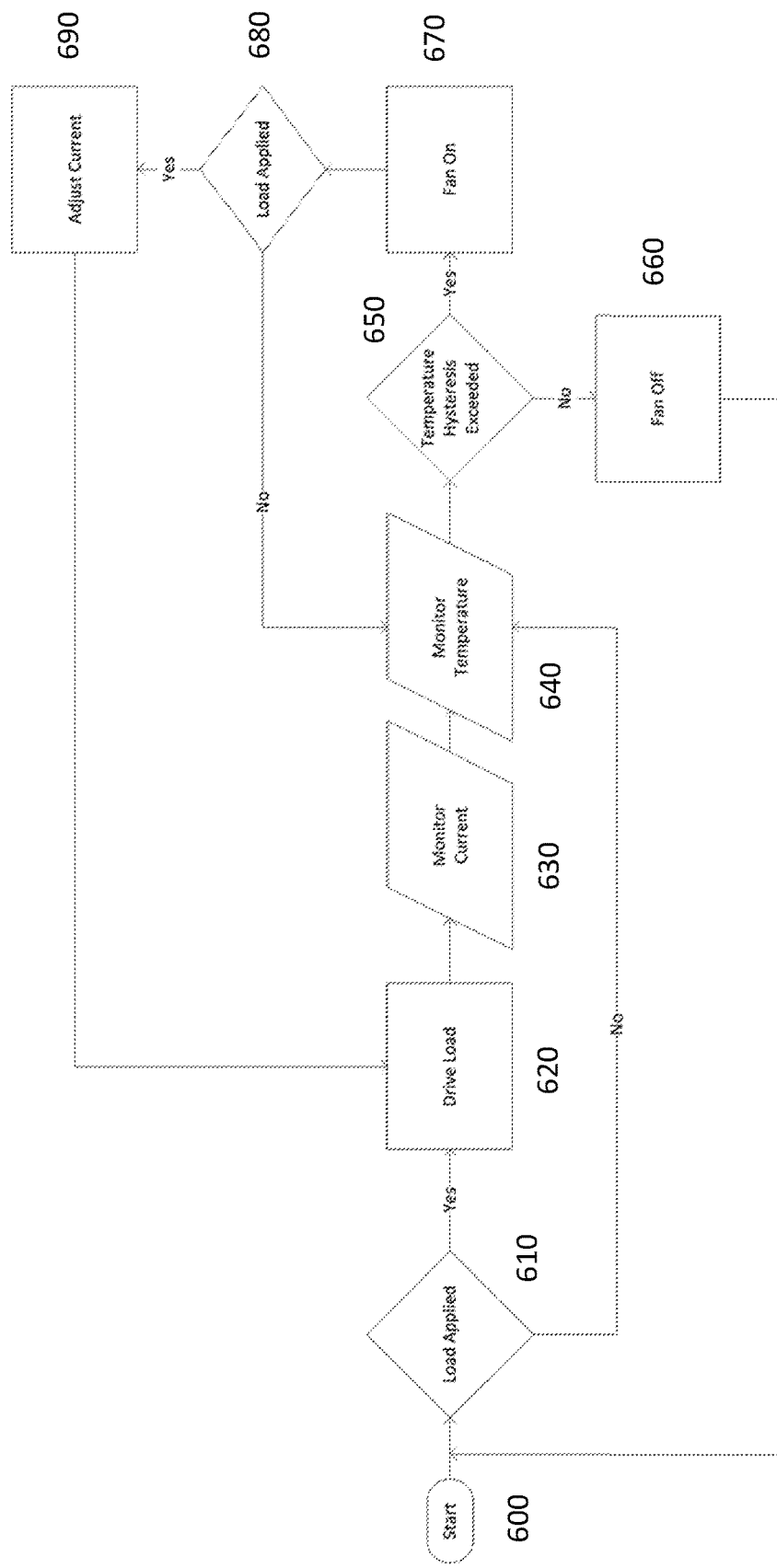
FIG. 6 is a logic diagram illustrating an exemplary method of operation of the disclosed heat removal system.

Referring now to FIG. 6, a logic diagram illustrating an exemplary method for removing heat from a wiring device will be described in greater detail. At 600, the method may start. At 610 the wiring device 100 may determine whether a removable load $102_1$-$102_n$ has been electrically connected to the wiring device (i.e., whether the plug of a removable load has been inserted into one of the line voltage and low voltage ports of the wiring device). If the wiring device 100 determines that a removable load $102_1$-$102_n$ has been connected, at 620 the wiring device may drive the removable load $102_1$-$102_n$ by providing an initial current level to the removable load. The wiring device 630 may monitor the current provided to the connected removable load $102_1$-$102_n$, and at 640 the wiring device may also monitor a temperature within a housing of the wiring device. (It will be appreciated that if the wiring device 100 determines, at 610, that a removable load $102_1$-$102_n$ has not been applied to the wiring device, the temperature monitoring at 640 may still be performed to ensure that a cooling flow of air is provided any time the sensed temperature within the housing is above a predetermined threshold.

At 650, the wiring device 100 may determine whether a temperature hysteresis has been exceeded. If at 660 the wiring device 100 determines that the temperature hysteresis has not been exceeded, then at 660 the fan 170 is de-energized and the method may return to the start 600, whereupon the method may be re-performed in the manner of a continual loop. If, however, at 660 the wiring device 100 determines that the temperature hysteresis has been exceeded, then at 670 the fan 170 is energized to provide a flow of air through the housing. At 680 the wiring device 100 may again determine whether a removable load $102_1$-$102_n$ is electrically connected to the wiring device. If the wiring device 100 determines that a removable load $102_1$-$102_n$ is not electrically connected to the wiring device, then the method returns to 640 and the wiring device continues to sense the temperature within the housing. If, however, the wiring device 100 determines that a removable load $102_1$-$102_n$ remains electrically connected to the wiring device, then at 690 the current applied to the removable load may be adjusted, and the method may return to 620, whereupon the removable load may be driven at the adjusted current. The method may continue in the manner previously described. It will be appreciated that in some embodiments the logic for performing the disclosed method may be embodied in instructions executed by the microcontroller logic circuit 200.

In various embodiments, when the fan is energized it may pass cooling air over a heat generating component located within the housing. In some embodiments hysteresis may be used for this temperature threshold settings to stop fan on/off oscillation.

Figure 7:
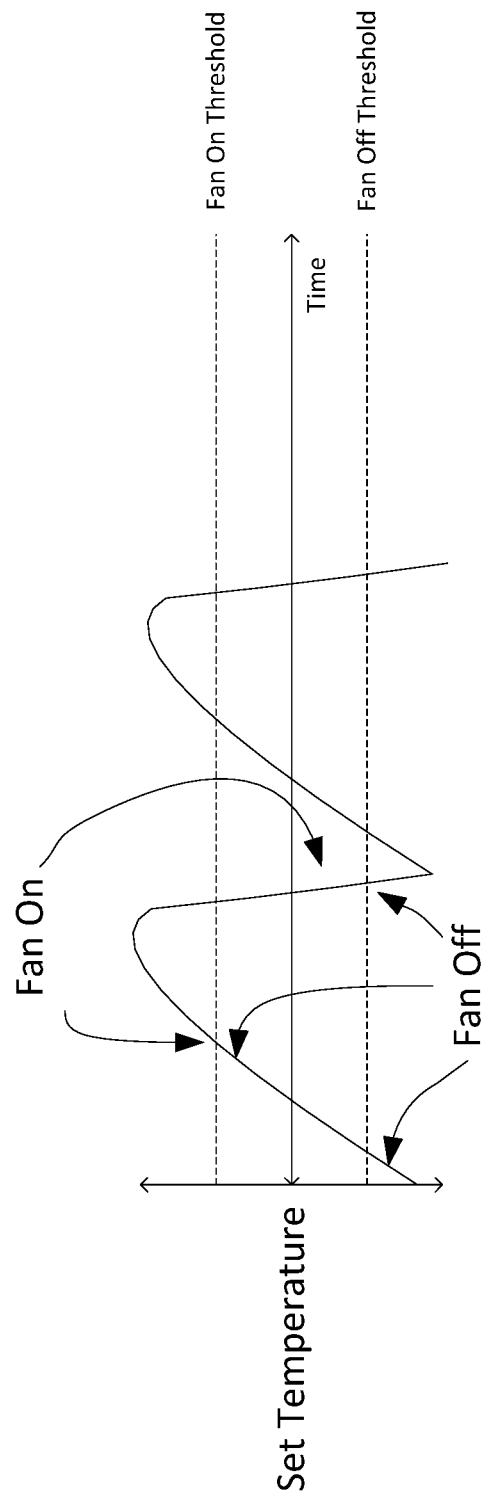
FIG. 7 is a graph illustrating an exemplary fan operational scheme based on sensed and threshold temperatures within the wiring device of FIG. 1.

As various removable loads $102_1$-$102_n$ are coupled to the wiring device 100, heat will be produced from the load drive circuit 208. This heat will cause temperature to increase and may affect the performance of the load drive circuit. In some embodiments the fan 170 be energized when the sensed temperature exceeds a first predetermined threshold, while the fan may be deenergized when the sensed temperature is less than a second predetermined threshold, where the second predetermined threshold is a value lower than the first predetermined threshold. Referring to FIG. 7, in various embodiments, the first predetermined threshold may comprise a "fan on" threshold, while the second predetermined threshold value may comprise a "fan off" threshold. The first predetermined threshold value may be greater than the second predetermined threshold. As can be seen, the sensed temperature in the housing may rise and fall over time, depending upon when the fan 170 is energized ("fan on") and de-energized ("fan off.") Thus, the fan 170 may be energized when the sensed temperature exceeds the "fan on" limit, and may remain energized until the sensed temperature falls below the "fan off" limit. Since the wiring device 100 may sense the internal housing temperature in a continuous or periodic manner, the result may be a housing temperature profile that, over time, resembles the shape illustrated in FIG. 7.

The "fan on" threshold may be a first predetermined amount above a fan "set" temperature, while the "fan off" threshold" may be a second predetermined amount below the fan "set" temperature. In some embodiments the first and second predetermined amounts are of equal magnitude, while in other embodiments the first and second predetermined amounts are of unequal magnitudes.

Some embodiments of the disclosed device may be implemented, for example, using a storage medium, a computer-readable medium or an article of manufacture which may store an instruction or a set of instructions that, if executed by a machine (i.e., processor or microcontroller), may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision additional modifications, features, and advantages within the scope and spirit of the claims appended hereto.

What is claimed is:

1. An in-wall electrical outlet comprising:
a housing arranged and configured to be received within a single gang wall box located in a wall or ceiling, the housing including at least one of a line voltage port and a low voltage port for providing power to a removable load, the housing having an intake opening in a first surface thereof for directing cooling air into an internal portion of the housing, the housing having an exhaust opening in a second surface thereof for exhausting heated air from the internal portion of the housing,
a strap to fasten the housing to the single gang wall;
a fan disposed within the housing, the fan operable to draw the cooling air in through the intake opening and to exhaust the heated air through the exhaust opening;
a thermal load disposed within the housing, the thermal load positioned to receive the cooling air to reduce a temperature of the thermal load;
a temperature sensor for determining a sensed temperature of the internal portion of the housing;
a microcontroller logic circuit for energizing the fan based on the sensed temperature of the internal portion of the housing; and
a safety shut off to reduce or disconnect power to the low voltage port if the fan is determined to have failed;
wherein the microcontroller logic circuit energizes the fan when the sensed temperature of the internal portion of the housing is determined to exceed a first predetermined threshold; and
wherein the microcontroller logic circuit determines the fan has failed when the sensed temperature exceeds the first predetermined threshold by a predetermined value and controls the safety shut off to reduce or disconnect power to the low voltage port.

2. The electrical outlet of claim 1, wherein energizing the fan comprises adjusting a speed of the fan.

3. The electrical outlet of claim 1, wherein the microcontroller logic circuit is configured to de-energize the fan when the sensed temperature of the internal portion of the housing is determined to be below a second predetermined threshold, the second predetermined threshold being lower than the first predetermined threshold.

4. The electrical outlet of claim 3, wherein the microcontroller logic circuit is configured to adjust a speed of the fan dependent upon the sensed temperature of the internal portion of the housing.

5. The electrical outlet of claim 1, wherein a current to the at least one of a line voltage port and a low voltage port is reduced when the sensed temperature of the internal portion of the housing is determined to be above the first predetermined threshold.

6. The electrical outlet of claim 5, wherein the microcontroller logic circuit is configured to vary a speed of the fan dependent upon the sensed temperature of the internal portion of the housing.

7. The electrical outlet of claim 5, wherein the microcontroller logic circuit compares the sensed temperature of the internal portion of the housing to the first predetermined threshold and a second predetermined threshold and to command the fan to be energized or de-energized based on the comparison.

8. The electrical outlet of claim 1, wherein the thermal load is at least one of a transformer and a heat sink.

9. The electrical outlet of claim 1, wherein the intake opening and exhaust opening are disposed in a side surface of the housing.

10. The electrical outlet of claim 9, wherein the intake opening is disposed in a rear cover portion of the housing and the exhaust opening is disposed in a front cover portion of the housing.

11. The electrical outlet of claim 1, wherein the low voltage port is configured to provide one of: a predetermined amount of power to the removable load, an amount of power required by the removable load, and a level of power based on the removable load.

12. The electrical outlet of claim 1 further comprising a cover plate, wherein the in-wall electrical outlet is flush mounted within the electrical box and the cover plate is configured to conceal at least a portion of the strap and at least a portion of the housing.

13. The electrical outlet of claim 1 further comprising a fan control circuit coupled to the fan and microcontroller logic circuit, fan control circuit is a switching circuit configured to selectively energize the fan.

14. The electrical outlet of claim 1, wherein the fan is positioned between the intake opening formed in the first surface of the housing and the exhaust opening formed in the second surface of the housing so that air moves through the housing in a desired manner to cool the thermal load disposed within the housing.

15. The electrical outlet of claim 1, wherein the housing includes a front cover portion and a rear cover portion, the rear cover portion including the intake opening and the first surface, the front cover portion including the exhaust opening and the second surface, the fan being positioned in the rear cover portion.

16. The electrical outlet of claim 15, wherein the fan is positioned adjacent to the thermal load disposed within the housing.

17. The electrical outlet of claim 16, wherein the fan is arranged and configured to draw air in through the intake opening in the rear cover portion, the air moving across the thermal load and through the exhaust opening in the front cover portion.

18. The electrical outlet of claim 1, wherein the intake opening and exhaust opening each comprise a plurality of louvers.

19. An in-wall electrical outlet comprising:
a housing enclosing a low-voltage electrical port for providing power to a removable load, the housing including a rear cover portion and a front cover portion coupled to the rear cover portion, an intake opening for directing cooling air into an internal portion of the housing, the intake opening being formed in one of the rear and front cover portions, the housing having an exhaust opening for exhausting heated air from the internal portion of the housing, the exhaust opening being formed in the other one of the rear and front cover portions;
a strap to fasten the housing to an electrical box located in a wall or ceiling;
a fan disposed within the rear cover portion of the housing, the fan operable to move air between the intake opening and the exhaust opening;
a temperature sensor for determining a sensed temperature of the internal portion of the housing;
a microcontroller logic circuit;
a thermal load disposed within the housing, the fan being positioned adjacent to the thermal load so that the thermal load receives the cooling air to reduce a temperature of the thermal load; and
a safety shut off to reduce or disconnect power to the low-voltage electrical port if the fan is determined to have failed;
wherein the microcontroller logic circuit:
energizes the fan when the sensed temperature of the internal portion of the housing is determined to exceed a first predetermined threshold;
de-energizes the fan when the sensed temperature of the internal portion of the housing is determined to be below a second predetermined threshold, the second predetermined threshold being lower than the first predetermined threshold; and
determines the fan has failed when the sensed temperature of the internal portion of the housing is determined to exceed a third predetermined threshold, the third predetermined threshold being greater than the first predetermined threshold, and controls the safety shut off to reduce or disconnect power to the low-voltage electrical port.

20. The electrical outlet of claim 19, wherein the intake opening and exhaust opening comprise a plurality of slots disposed in a side surface of the housing.

21. The electrical outlet of claim 20, wherein the intake opening is disposed in a rear cover portion of the housing and the exhaust opening is disposed in a front cover portion of the housing.

22. A method for removing heat from an in-wall electrical outlet having a strap to fasten the outlet to an electrical box located in a wall or ceiling; the electrical outlet, comprising:
receiving a current from a power supply;
providing the received current to at least one of a line voltage port and a low voltage port of the outlet;
providing a first removable load with the current via the at least one line voltage port or low voltage port of the outlet;
determining a temperature within a housing of the outlet;
energizing a fan disposed within a housing of the outlet when the temperature inside of the housing is determined to exceed a first predetermined threshold;
de-energizing the fan when the temperature inside of the housing is determined to be below a second predetermined threshold, the second predetermined threshold being lower than the first predetermined threshold; and
determining the fan has failed when the temperature inside of the housing is determined to exceed a third predetermined threshold, the third predetermined threshold being greater than the first predetermined threshold; and
reducing current to the low voltage port if the fan is determined to have failed, the current to the low voltage port being reduced to a non-zero magnitude so that the outlet operates in a reduced power mode.

23. The method of claim 22, further comprising, when the fan is energized, drawing cooling air into the housing through an intake opening in the housing and exhausts heated air out of the housing through an exhaust opening in the housing.

24. The method of claim 22, further comprising passing air from the fan over a thermal load located within the housing when the fan is energized.

* * * * *